United States Patent [19]

Medwin

[11] 4,367,438

[45] Jan. 4, 1983

[54] ELECTRONIC MEASURING APPARATUS

[76] Inventor: Albert H. Medwin, 65 Castle Howard Ct., Princeton, N.J. 08540

[21] Appl. No.: 218,869

[22] Filed: Dec. 22, 1980

[51] Int. Cl.$^3$ .......................................... G01R 27/00
[52] U.S. Cl. ................................................ 324/57 R
[58] Field of Search ................ 324/57 R, 57 Q, 57 SS

[56] References Cited
U.S. PATENT DOCUMENTS
3,711,770 1/1973 Wilson .............................. 324/57 R FOREIGN PATENT DOCUMENTS
2426859 1/1976 Fed. Rep. of Germany .... 324/57 R Primary Examiner—Krawczewicz
Attorney, Agent, or Firm—Robert D. Farkas

[57] ABSTRACT

An electronic measuring apparatus utilizes an RC oscillator, having one fixed impedance element, in one feedback loop, and two similar impedance elements alternately and separately coupled into the circuit, utilizing separate transmission gates and separately energizable inverters, each tandemly operated so as to disengage one of the similar impedance elements, while the other impedance element is being utilized. The output of the device is two separate and sequential streams of pulses, each reflecting the magnitude of each of the similar impedance elements, when employed in the circuit. Stability and response time is enhanced, permitting accurate measurement of a variable impedance element, against a like but fixed impedance element, if desired. Display means are provided, after both series of pulses are electively added, subtracted, multiplied, or divided.

22 Claims, 7 Drawing Figures

ELECTRONIC MEASURING APPARATUS

BACKGROUND OF THE INVENTION

The Field of the Invention

This invention relates to measuring and indicating devices, and more particularly to that class of apparatus utilizing electronic components for the measurement of changes in the value of selected electronic components, displaying same in a visual or audible manner.

In particular, this invention relates to an electrical measuring device in which the change in the physical condition to be observed is applied to vary the reactance or resistance of an element in the measuring circuit. In the past, variable reactances have been arranged in bridge circuits, or used to vary the frequency of an oscillator, in order to obtain an indication of the change in magnitude of the reactance due to the change in the physical condition under observation. Such arrangements have been and are, to a great extent, relatively complicated and uncertain in operation. It is an object of the present invention to provide a simple arrangement which is extremely reliable and free from extraneous input, providing an error free measuring device.

A further object of the present invention is to provide an apparatus which is capable of measuring the change in the magnitude of the reactance which is comparatively unaffected by variations in supply potential.

Another object of the present invention is to provide an apparatus for comparing the relative magnitude of two similar reactances, especially in case wherein one reactance is a standard and the other is responsive to some external force, modifying its magnitude.

A still further object of the present invention is to provide a measuring device which performs its measurement repeatedly, over short periods of time, so as to eliminate drift considerations and the introduction of error thereby.

Yet another object of the present invention is to provide measurement device which utilizes solid state circuitry for switching purposes, thereby eliminating noise, error, delay, and bulk and weight.

A yet further object of the present invention is to provide switching circuit configurations such that only the impedance of the switched similar reactance elements are involved in the measuring technique, thereby eliminating relying upon dissimilar elements, appropriate to one or the other similar impedance elements.

A still further object of the present invention is to provide economically constructed circuit configuration wherein only the similar reactance elements are switched, such that other elements, non-reactive in nature, that are simultaneously switched with the elected similar reactance elements, do not create an error in the measurement of the reactance element in use.

A further object of the present invention is to provide an apparatus which has an output capable of being transmitted along a pair of conductors, containing signal information therealong, reflecting both of the similar impedance elements reactance magnitude, after their sequential use.

Yet another object of the present invention is to provide a frequency measuring device, dependent upon the magnitude of the reactance of similar reactances, whose output reflects alternately the impedance of each of the similar reactance elements, thereby a full range of arithmetic operations to be performed on the output signal.

Other objects and advantages of the present invention will become apparent during the course of the following description of the accompanying drawings in which FIG. 1 is schematic representation of a prior art resistance-capacitance electronic oscillator.

Figure 1:
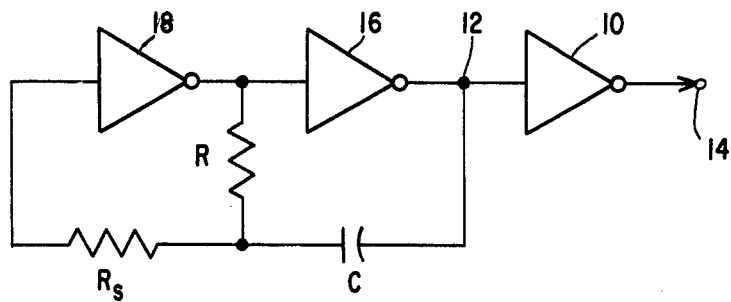

Referring to the figures, there can be seen in FIG. 1 a conventional and well known electronic RC oscillator, well known in the art. Inverter 10 acts as a buffer inverter, for output terminal 12 of the device. Available at terminal 14, are a series of pulses, whose frequency are determined by the magnitude of resistor R and the magnitude of capacitor C. $R_s$ serves as a stabilizing resistor. Inverters 16 and 18 generate the output pulses at terminal 12. The frequency of such output pulses are inversely proportional to the product of R times C. If resistor R were to be substituted for another value of resistance, or in the alternative, if capacitor C were to be changed for another value of capacitance C so as to obtain two series of pulses at terminal 14, each reflecting the magnitude of the substituted or changed reactance, then, the switching circuitry, not shown, and the time to accomplish same, would all affect the accuracy of the frequency of the pulses generated by such an apparatus. Most importantly, if mechanical switching to be utilized, or if electronic switching of the unimproved variety, disclosed here, was to be employed, the impedance of the switching mechanisms would, in of itself, introduce an inherent error. Though attempts have been made to utilize two pairs of circuits similar to FIG. 1, the results obtained were poor since it was difficult if not impossible to maintain one such circuit as a standard, whilst attempting to utilize the other such circuit for the measuring component of a measuring equipment.

Figure 2:
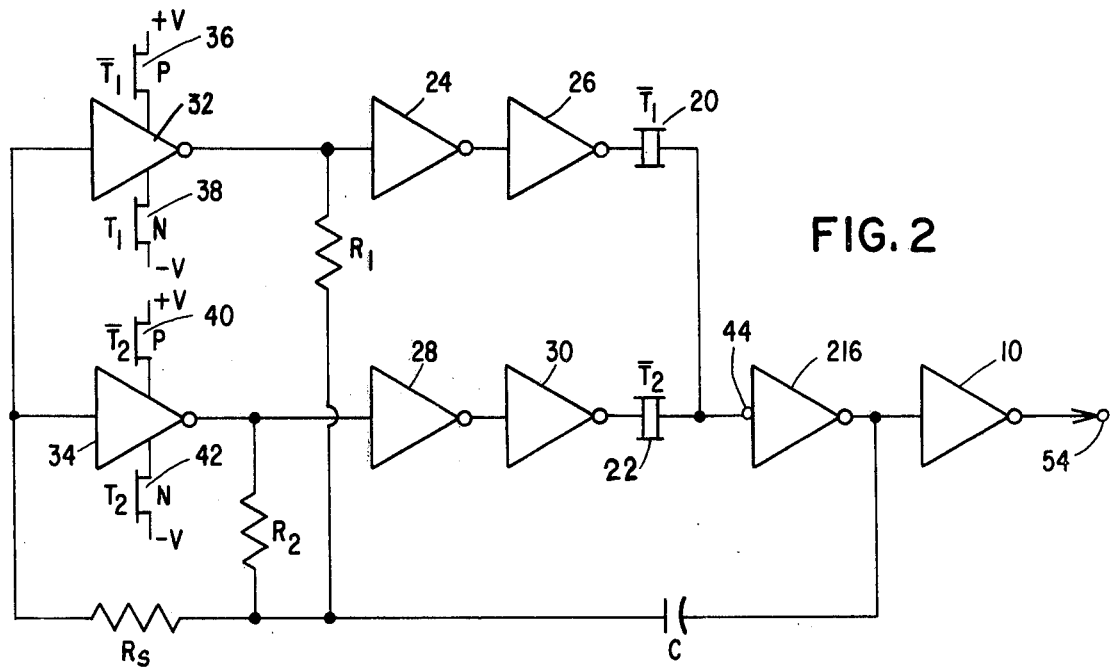
FIG. 2 is a portion of a circuit diagram of the apparatus of the present invention.

As can be seen, in FIG. 2, buffer inverter 10 is coupled to inverter 216. Resistor 1 and resistor 2 are shown joined together, with one pole of capacitor C and one terminal of stabilizing resistor, $R_s$. In all other respects, the circuit shown in FIG. 2 differs from the prior art circuit, in that transmission gates 20 and 22 are shown to inverters 24 and 26, and inverters 28 and 30 respectively. Additionally, inverters 32 and 34 are shown, substituting in general for inverter 18, as shown in FIG. 1. Transistors 36 and 38 control the operating power for inverter 32. In similar fashion, transistors 40 and 42 control the operating power for inverter 34. When transistors 36 and 38 are conducting, as shown to occur when time period $T_1$, occurs, inverter 32 is disposed in the circuit, becomes operational, and effectively couples the upper terminal of $R_1$ to $R_s$. Simultaneously, transmission gate 20 is closed, permitting inverters 24 and 26 to be disposed in the circuit, coupling thereby the upper end of resistor 1 to the input terminal 44, of inverter 216. In similar fashion, transistors 40, 42 and transmission gate 22, all control coupling inverters, 34, 28 and 30, into the circuit. Obviously, to obtain a successive string of two pulses, each being disposed serially with one another, at alternate times, and having different frequencies, it would be necessary to operate inverters 32, 24 and 26, as well as transmission gate 20, exclusively from the time that inverters 34, 28 and 30, and transmission gate 22 operate. In short, resistance $R_1$ is introduced in the circuit, only when inverters 32, 24 and 26, and transmission gate 20, are all operable. Similarly, resistance $R_2$ is employed when inverters 34, 28 and 30, as well as transmission gate 22 are operable. It can thus be seen that there are two time intervals, each reflecting the impedance of resistance $R_1$ and $R_2$, at different successive time intervals, depending upon which combination of active elements are employed. The apparatus disclosed here, may utilize if desired, circuit configurations wherein $R_1$ and $R_2$ can be operated into the frequency determining condition simultaneously. However, as shown in FIGS. 1-7 herein, simultaneous utilization is not discussed further.

It can be readily seen from FIG. 2, that when either inverter 32 or 34 are disposed in the non-operating condition, the uppermost terminal of its associated resistor is not coupled to the left hand end terminal of the stabilizing resistor, $R_s$. Similarly, when either transmission gates 20 or 22 open, then, inverters 24 and 26, operating as a pair, and inverters 28 and 30, similarly operating as a pair, are not coupled to input terminal 44, thereby successfully and totally decoupling the uppermost terminals of resistors $R_1$ and $R_2$. Power is conserved when only one reactive element, $R_1$ or $R_2$, is utilized, by virtue of disengaging such elements from draining any power due to the decoupling effect of transistors 36, 38, 40 and 42. Since the order of magnitude of the impedance of an inoperable inverter 32 or 34 is virtually unlimited, then, coupling the unused resistive element of the pair of elements $R_1$ and $R_2$ to the used resistive element is virtually unmeasurable. The change in impedance experienced by the transmission gate, in its on and off condition, is extremely dramatic in magnitude, and since it is located at the input terminal of inverter 216, is masked by the gain of inverter 216. Here, the transmission gate impedance is virtually unimportant due to the gain effect achieved by the pairs of inverters coupled to an active transmission gate. The effective result of the location of an active transmission gate is to impose virtually no series resistance, whilst the same location, for an inactive or open transmission gate, coupled with an associated inactive inverter, causes the overall accuracy of the measuring device, shown in FIG. 2, to be virtually unaffected by the inclusion of these extra components.

It should be noted that four inverters are required, for proper phase shifting purposes, in the apparatus shown in FIG. 2, as opposed to two inverters, shown used in the oscillator portion of the circuit of FIG. 1. When $R_1$ is being utilized, inverter 32 is the equivalent of inverter 18 of FIG. 1. Inverters 24 and 26 of FIG. 2, as well as invertor 216, act as the single inverter 16, shown in FIG. 1.

Figure 3:
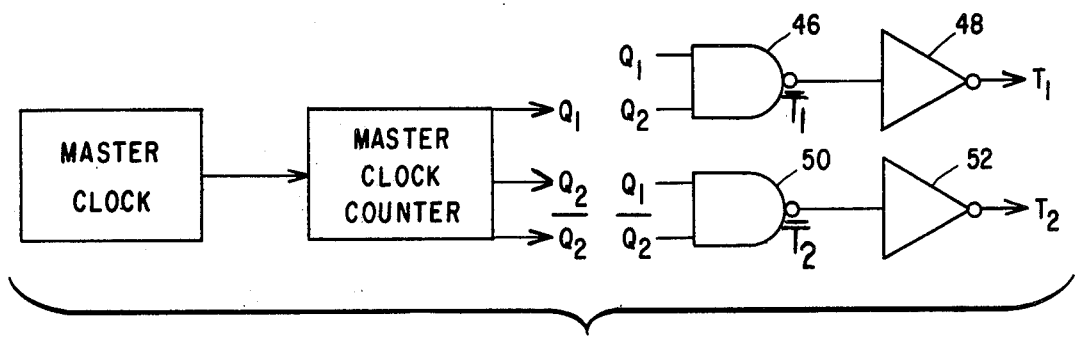
FIG. 3 is a block diagram of another portion of the present apparatus.

FIG. 3 illustrates a timing train generating device, well known in the art, having a master clock, whose output is coupled to a master clock counter. Such counter is shown provided having three outputs, which are coupled to the inputs of two 2-input Nand gates. The output of such gates, such as 2-input Nand gate 46, is shown coupled to inverter 48. The output of inverter 48 produces a pulse, denominating time period $T_1$. Similarly, Nand 50 is coupled to inverter 52, shown in FIG. 2, whose output produces a delayed alternate time period, denominated as $T_2$. Both time periods $T_1$ and $T_2$ are of substantial duration, relative to the general frequency observable at the output terminal 54, shown in FIG. 2. It should be noted that terminal 54 is similar to terminal 14, as shown in FIG. 1. Output signals $T_1$ and $T_2$, are utilizable directly in the apparatus shown in FIG. 2, for purposes of controlling same, and producing an output terminal 54, a stream of first pulses, not shown, followed by a stream of second pulses, where, resistor $R_1$ is first employed, during time period $T_1$ and resistor $R_2$ is employed, during time period $T_2$. Naturally, an additional time period $T_1$, follows the first time period $T_2$, and the circuit continues to generate thereafter, repetitive sequential pulses, during time periods $T_1$ and $T_2$.

Figure 4:
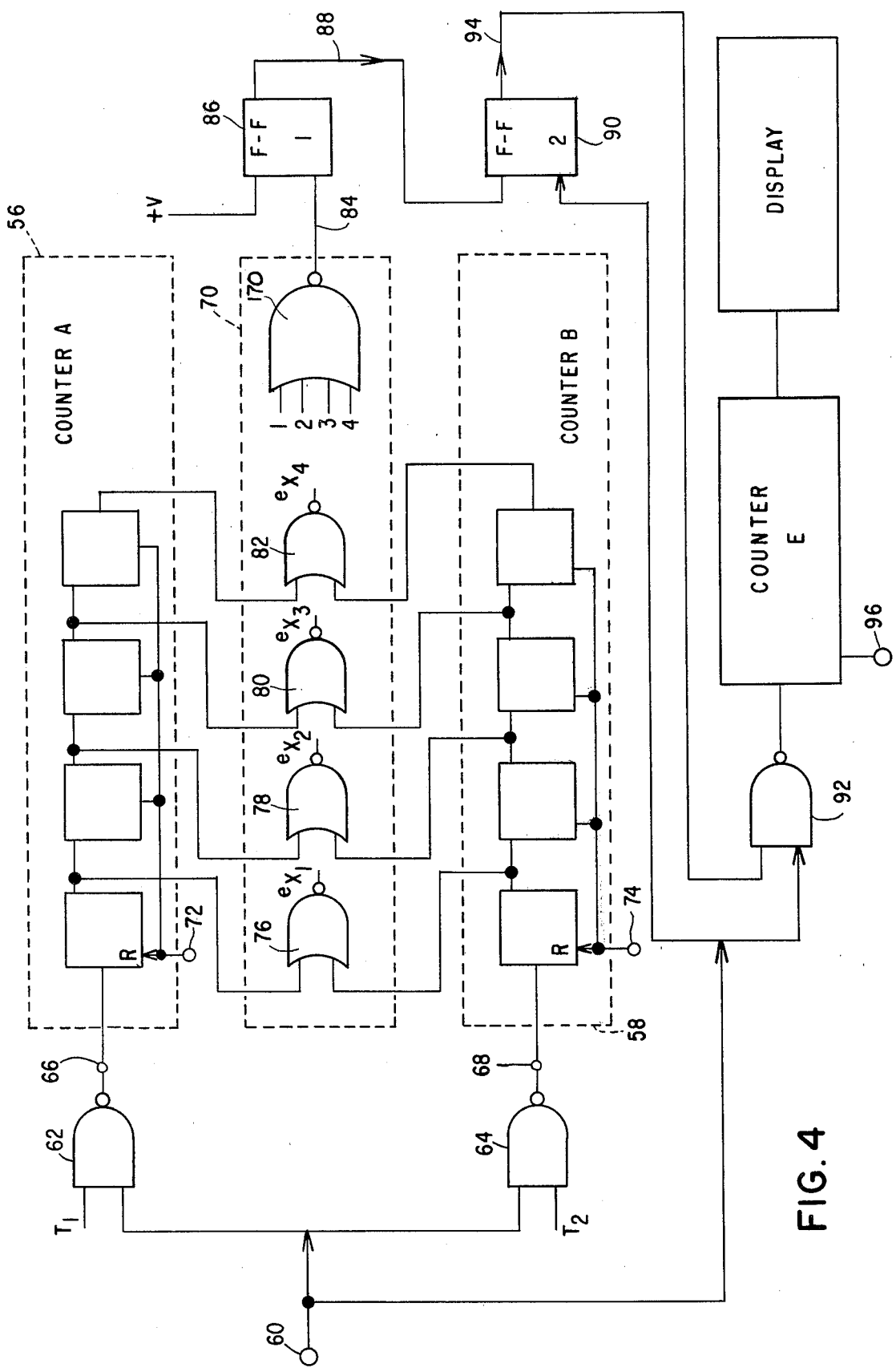
FIG. 4 is a block diagram of a supplementary mathematical processor for subtraction, utilizable with the present invention.

FIG. 4, illustrates an apparatus which may be utilized, in conjunction with the apparatuses shown in FIGS. 2 and 3, so as to provide, at the display, a display of a numerical output, representing the difference between the number of pulses generated during the time periods that $R_1$ and $R_2$, shown in FIG. 2, are employed. Dotted lines 56 contain therein, a counting device, denominated as counter A. Similarly, dotted lines 58 contain counter B. Terminal 60 is coupled to, not shown, output terminal 54, shown in FIG. 2. Two input Nand gates 62 and 64 both have one of their input terminals fed by the stream of sequential and alternate pulses provided by the oscillator described in FIG. 2. Their other input terminals are individually coupled to the outputs of inverters 48 and 52, shown in FIG. 3. Thus, the signal present at terminals 66 and 68, represent respectively, the stream of pulses generated by resistor $R_1$ and resistor $R_2$ respectively. Counter A and counter B are intercoupled by a comparative circuit shown within the confines of dotted lines 70. Such comparative circuit employs four 2-input exclusive-OR gates. The output of such gates are coupled to a four input Nor gate 170. Each stage, adjacent its sister stage, in counters A and B, are identical. In the event that the count, located in each sister stage is equal, then the output of each of the exclusive-OR gates 76, 78, 80 and 82, is "zero". If all inputs to Nor gate 170 are "zero", then the output available on lead 84 is "one". A flip-flop circuit, well known in the art, is contained within block 86. As the number of pulses being counted by the counter being loaded reaches the count in the previously loaded counter, then the signal available on lead 84 goes to "1" and causes a change of state of flip-flop 86, forcing same to "one". Later, if the count seen by the loaded counter exceeds, by at least one pulse or more the count in its sister counter, then while flip-flop 86 remains at "one", the signal on lead 94 goes to "one", since flip-flop 90 has now changed its state. At this time, flip-flop 90 is set, retaining the information that there was a difference between the frequency of the stream of pulses during time periods $T_1$ and $T_2$.

The output of box 90 is coupled to an input terminal of Nand gate 92, whose other input terminal contains the signal at terminal 60, namely the difference between the highest number of pulses and the lowest pulses counted. In this case, the output of Nand gate 92 feeds counter E, of conventional design, which in turn operates a display apparatus, indicating the difference in number of pulses in time periods $T_1$ and $T_2$. Output terminal 94, shown emanating from block 90, may be utilized to operate plus and minus display elements, not shown, on the display, as desired. Prior to, and in a manner well known in the art, before each successive count for counter A, reset terminal 72 is energized, causing counter A—in preparation for the next $T_1$ cycle—to count afresh. The same concept is employed for counter B, by utilizing reset terminal 74.

As can be seen, the output on the display represents the difference in resistance values, between $R_1$ and $R_2$, wherein such difference values are displayed numerically, repetitively, with each display being totally independent of its successive display period. Counter E is strobed once every pair of cycles for inverter 48 or 52, as shown in FIG. 3, followed by resetting terminal 96 of counter E. Least significant digit techniques, well known in the art, may be employed if desired to eliminate jitter to average readings—as desired. Successful readings have been obtained, utilizing display repeat rates of less than one second, without any jitter being observed. Fixed carbon-type resistors, utilized for one of the resistive elements $R_1$ or $R_2$, while an extremely light and fast responding thermistor, utilized for the other resistive element, permits temperature readouts to be accomplished during a rapid temperature rise of the temperasensing resistive element.

Figure 5:
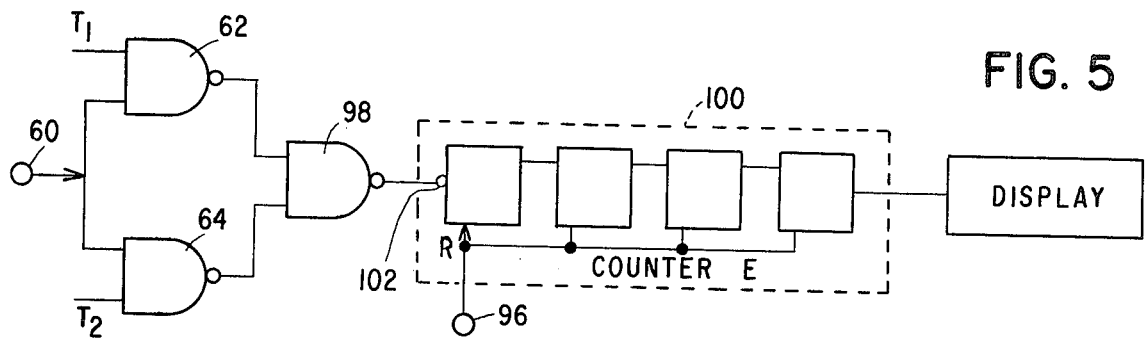
FIG. 5 is a block diagram of a supplementary mathematical processor for addition, utilizable with the present invention.
Figure 6:
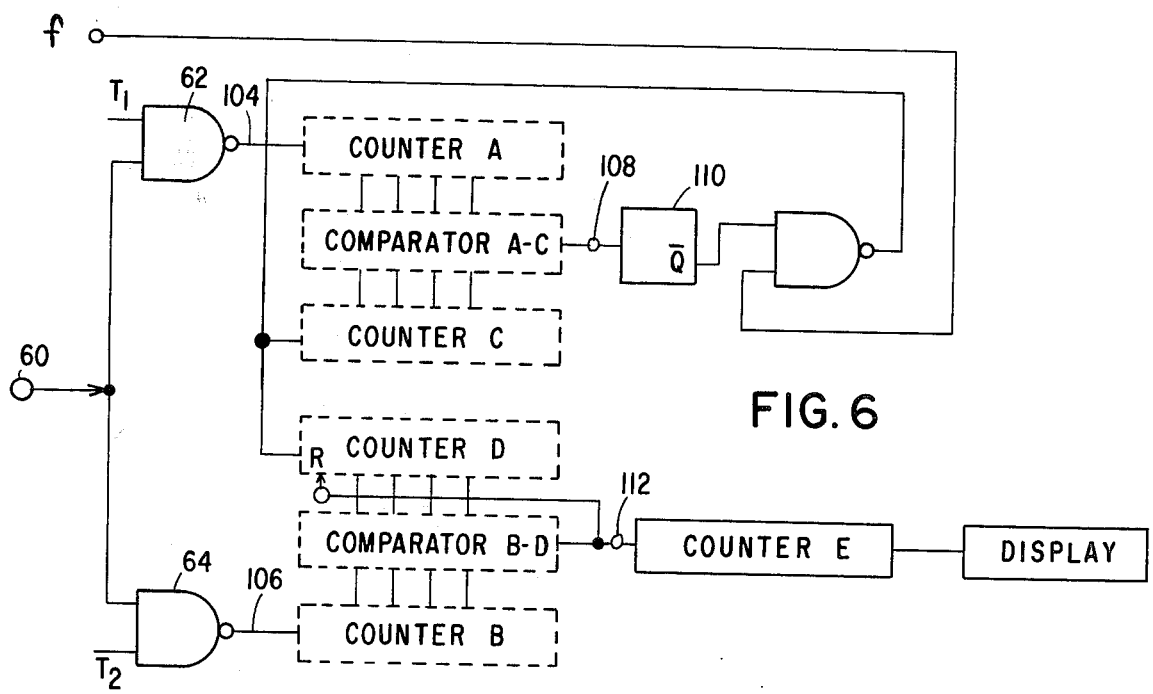
FIG. 6 is a block diagram of a supplementary mathematical processor for division, utilizable with the present invention.

FIG. 5 illustrates a display apparatus, similar to the apparatus employed in FIG. 4, as well as counter E, having resetting input terminal 96 thereon. Dotted lines 100, define counter E, showing how the interconnection between each of the stages thereof to terminal 96. In similar fashion to Nand gates 62 and 64, shown in FIG. 4, Nand gate 98 is provided with its inputs each having the stream of pulses derived during times $T_1$ and $T_2$. Input terminal 102, of counter E, thus is fed by streams of pulses generated during time perods $T_1$ followed by time period $T_2$. Counter E is strobed, in a fashion not shown but well known in the art, at the conclusion of each pair of time periods $T_1$ and $T_2$ such that the display will accurately reflect the sum of the number of pulses generated during time periods $T_1$ and $T_2$ FIG. 6 is a schematic representation of a dividing system whose input 60 is coupled to the output terminal 54, of the apparatus shown in FIG. 2. Nand gates 62 and 64 operate in an indentical fashion to the equivalently numbered Nand gates shown in FIG. 4. Counter A has its input terminal 104 fed with the streams of pulses generated during time period $T_1$. Similarly, counter B has its input terminal 106 fed with pulses generated during time period $T_2$. Counter A and C, as well as comparator A-C, operate in identically the same fashion, as the equipment described in FIG. 4, excepting that counter C is fed with identically the same signal as is produced at terminal 60. Counter B is fed with the same information, as is counter B, shown in FIG. 4. In effect, since division is required, the dividend is being loaded into counter A, whilst the divisor is being loaded into counter B. The same pulse train, as shown, are simultaneously fed into counters C and D. Presuming, by way of example, that the dividend has a value of nine, and the divisor has a value of three, then, after the third pulse, the outputs of B and D will be equal and the signal, available at terminal 112 will go to "one". Before the next pulse, however, counter D will be set to zero, by virtue of the fact that the signal at terminal 112, is at "one". A single pulse will then enter counter E. Three pulses later, the count in counters B and D will again become equal, the count in counter C will have advanced to six. At this time, terminal 112 again goes to "one", resetting counter D, loading another single pulse into counter E, thereby advancing the count therein to two. After still another three pulses, the count in counters B and D again are equal, making the signal at terminal 112 go to "one". At the same time, the count at counters A and C are now equal, causing the output of comparator A-C to go to "one". When the signal on terminal 108 goes to "one", no further signals enter counters C and B, due to the action of inhibition of the unlabeled Nand Gate, thus ending the division. Terminal 112, being "one", has reset counter D to zero, and has advanced counter E to number three, the quotient. There is a "remainder" of zero in counter D. In the event that the division is not even, then, the remainder, if any, would remain in counter D. As can be seen, the number of pulses contained during time period $T_1$ may be divided by the number of pulses contained during the time period $T_2$. The symbol "f" represents an external source signal continuously and independently operational and not synchronized with pulses generated during time periods $T_1$ and $T_2$, though generally operating at a somewhat higher frequency than the pulses that occur during time periods $T_1$ or $T_2$.

Figure 7:
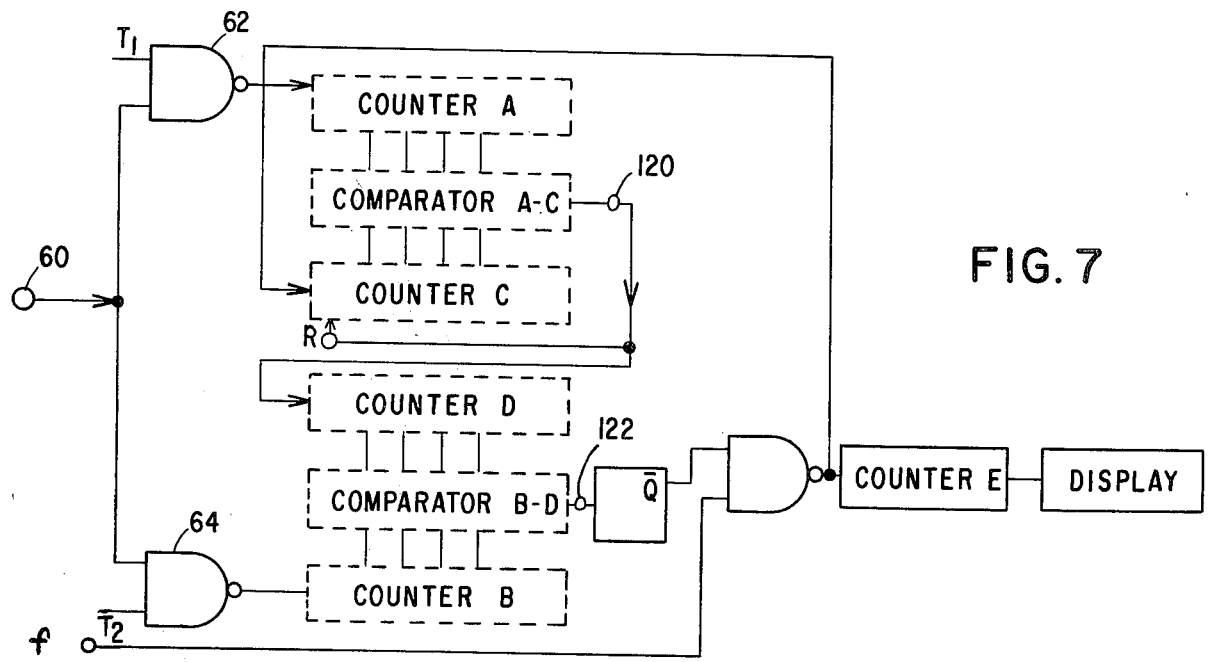
FIG. 7 is a block diagram of a supplementary mathematical processor for multiplication, utilizable with the present invention.

FIG. 7 illustrates the block diagram of an apparatus utilized for multiplication, involving the equipment shown in FIGS. 2 and 3. Here, the input signal available at terminal 60, is the same input signal provided at the output terminal 54, shown in FIG. 2. Nand gate 62 and 64 serve the same purposes as in FIG. 4. Counter A, counter C and comparator AC, are disposed in electrical connection similarly to that shown in FIG. 4 with counter C being the equivalent of counter B. In similar fashion, counter D and counter B, of FIG. 7, as well as comparator B-D, are in the same circuit configuration as that shown in FIG. 4 for equivalent elements counter A and counter B. It has been shown, that the apparatus utilized in FIG. 6, for purposes of division, utilize a series of subtractions. In similar fashion, multiplication can be accomplished by a series of additions. Presuming that the multiplicand, having a value of 4, is loaded into counter A, as the output of Nand gate 62. The multiplier, being 3, by way of example, is loaded into counter B as the output of Nand gate 64. A series of pulses simultaneously gated to the inputs of counters A and E. At the fourth pulse, the count in counter A and in counter C is equal. Signal available at terminal 120 will then go to "one". Counter A is reset, at the same time, in a fashion similar to that employed in the circuit shown in FIG. 6. A single pulse will then proceed to counter D, since counter D has its input coupled to terminal 120. At this point, in time, the count in counter E is four and the display, if capable of it, will display four. After an additional count of four more pulses, the count in counter A equals the count in counter C once again. The count in counter D will now advance to two, and the count in counter E will advance to eight. After an additional four more pulses, the count in counter D will advance to three, while the count in counter E advances to twelve. Simultaneously, the total count in counters B and D will be equal, and, signal available at terminal 122, will go "high", ending the cycle. The count in counter E at this time, totals twelve, the product. Thus it can be seen that the process of multiplication can be accomplished by multiplying the total number of pulse counts in the pulse trains contained during the time periods of $T_1$ and $T_2$, displaying same on a display apparatus—as desired. "f" as shown, is the same "f" as described in FIG. 6.

It will be appreciated that the preferred embodiment illustrates an R-C oscillator circuit, wherein the resistive element is switched electronically between a standard or variable or in between two standards, and the C element is maintained as a constant, opposite reactive circuits, may be employed, with the fixed reactive element being a resistor, and the switched or selected reactive element being a capacitor. Additionally, the circuit components shown, may be of any equivalent variety, at the will of the designer.

While there has been shown a preferred embodiment of a measurement device, accordance with this invention, it will be appreciated that changes and modifications may be easily made within the scope of the invention.

I claim:

1. A measurement device comprising electronic oscillator means for producing a plurality of output pulses, said oscillating means including a first frequency varying means for varying the frequency of said output pulses, said first frequency varying means including a first impedance element, said oscillator means including a first inverter, said first impedance element coupled to said first inverter, said first inverter having an input terminal coupled thereto, said oscillator means including a second frequency varying means for varying said frequency of said output pulses, at least second and third impedance elements, at least second and third inverters, said second impedance element coupled to said second inverter, said third impedance element coupled to said third inverter, coupling means for exclusively alternately coupling the combination of said second impedance element and said second inverter and the combination of said third impedance element and said third inverter to said input terminal during at least two sequential separate time periods, whereby a first sub-plurality of said plurality of output pulses is generated by said oscillator means during the first of said two time periods and whereby a second sub-plurality of said plurality of pulses is generated by said oscillator means during the second of said two time periods.

2. The apparatus as claimed in claim 1 further comprising means for counting and periodically disposably storing a number of pulses being the total number of said plurality of said output pulses occurring during said first and said second time periods.

3. The apparatus as claimed in claim 2 wherein said means for counting includes separate first and separate second counting means for independent counting and independently periodically disposably storing said first and said second sub-plurality of pulses.

4. The apparatus as claimed in claim 2 further comprising display means, said display means being coupled to said means for counting, said display means for providing a visual display of said total number.

5. The apparatus as claimed in claim 3, further comprising arithmetic operating means including processing means for arithmetically processing said at least first and second sub-plurality of pulses in at least one of a class of arithmetic operations, wherein said class of arithmetic operations comprise the operations of subtraction, multiplication, and division, said arithmetic operating means including means for generating and resetably storing a second plurality of pulses.

6. The apparatus as claimed in claim 3 further comprising comparative circuit means, said comparative circuit means for comparing said at least said first sub-plurality of pulses with at least said second sub-plurality of pulses, said comparative circuit means including a single pulse generating means for generating a single pulse when the number of said first plurality of pulses equals the number of said second sub-plurality of pulses.

7. The apparatus as claimed in claim 6 further comprising another single pulse generating means, said another single pulse generating means for generating another single pulse when the number of said second sub-plurality of pulses exceeds the number of said first sub-plurality of pulses.

8. The apparatus as claimed in claim 1 wherein said first impedance element comprises a capacitor, wherein said second and third impedance elements each comprise resistors.

9. The apparatus as claimed in claim 1 further comprising a first transmission gate, a second transmission gate, said first transmission gate and said second transmission gate being coupled to one another, said first transmission gate and said second transmission gate being coupled to said input terminal.

10. The apparatus as claimed in claim 8 further comprising a fourth inverter, a fifth inverter, said fourth inverter being coupled to said first transmission gate, said fifth inverter being coupled to said second transmission gate.

11. The apparatus as claimed in claim 9 wherein said second impedance element is coupled to said fourth inverter and wherein said third impedance element is coupled to said fifth inverter.

12. The apparatus as claimed in claim 1 wherein said first inverter is operated only during said first of said two time periods and said third inverter is operated only during the second of said two time periods.

13. The apparatus as claimed in claim 1 wherein said second and said third impedance elements each couple to one another and to said first impedance element, at a common terminal.

14. The apparatus as claimed in claim 1 wherein said oscillator means comprise a resistance-capacitance electronic oscillator.

15. The apparatus as claimed in claim 1 further comprising a buffer inverter, said buffer inverter coupled to said first inverter.

16. The apparatus as claimed in claim 1 wherein said at least second and said at least third inverters each comprise a pair of inverters coupled together in series circuit configuration.

17. A measurement device comprising electronic oscillator means for producing a plurality of output pulses, said oscillating means including first frequency varying means for varying the frequency of said output pulses, second frequency varying means for varying the frequency of said output pulses, said first frequency varying means including a first impedance element, said second frequency output varying means including a second impedance element, said first impedance element and said second impedance element each having substantially equivalent proportional resistive and reactive components, said first frequency varying means and said second frequency varying means including a third impedance element, said third impedance element having a resistive and a reactive element in quadrature to said resistive and said reactive components of said first and said second impedance elements, a first and a second and a third and a fourth and a fifth and a sixth and a seventh inverter, said first and said second and said third and said fourth and said fifth and said sixth and said seventh inverters and said first and said second and said third impedance elements each having a pair of terminals, one of said terminals of said first impedance element and said second impedance element and one of said terminals of said third impedance element being coupled together, one of said terminals of said second inverter being coupled to one of said terminals of said third inverter, one of said terminals of said fifth inverter being coupled to one of said terminals and said sixth inverter, a first and second transmission gate, said first and said second transmission gates each having a pair of terminals, one of said pair of terminals of said first transmission gate being coupled to one of said pair of terminals of said second transmission gate, the other of said pair of terminals of said first transmission gate being coupled to the other of said pair of terminals of said third inverter, the other of said pair of terminals of said second transmission gate being coupled to the other of said pair of terminals of said sixth inverter, one of said pair of terminals of said first inverter being coupled to the other of said pair of terminals of said second inverter and being coupled to the other terminal of said first impedance element, the other terminal of said fifth inverter being coupled to one of said terminals of said fourth inverter and being coupled to the other of said terminals of said second impedance element, the other terminal of said pair of terminals of said first inverter and the other terminal of said pair of terminals of said fourth inverter being coupled together and being coupled to said first terminal of said first impedance element and said first terminal of said second impedance element and said first terminal of said third impedance element, one of said terminals of said seventh inverter being coupled to said first terminal of said first and said second transmission gates, the other of said terminals of said seventh inverter being coupled to the other of said pair of terminals of said third impedance element, means whereby said first transmission gate and said first inverter are gated simultaneously and periodically, means whereby said second transmission gate and said fourth inverter are gated simultaneously and periodically, means whereby said first inverter and said fourth inverter are gated during separate time periods, whereby two strings of pulses are generated at said other terminal of said seventh inverter, whereby the first of said two strings of pulses have a frequency determined by said resistive and said reactive components of said first and said third impedance elements, whereby the other of said two strings of pulses have a frequency determined by said resistive and reactive components of said second impedance element and said third impedance element, whereby said first string of frequencies are generated only when said first inverter and said first transmission gate are gated into operation, whereby said second of said two strings of pulses are generated when said fourth inverter and said second transmission gate are gated into operation.

18. The apparatus as claimed in claim 17 further comprising a calibrating impedance, said calibrating impedance having a pair of terminals, one of said pair of terminals of said calibrating impedance being coupled to said other terminal of said first inverter and said other terminal of said fourth inverter, the other of said pair of terminals of said calibrating impedance being coupled to said one terminal of said first impedance element and said one terminal of said second impedance element and said one terminal of said third impedance element.

19. The apparatus as claimed in claim 17 wherein said first impedance element and said second impedance element comprise resistors and said third impedance element comprises a capacitor.

20. The apparatus as claimed in claim 17 wherein said first and said second impedance elements comprise capacitors and said third impedance element comprises a resistor.

21. The apparatus as claimed in claim 17 further comprising means to vary the magnitude of the impedance of said first impedance element and said second impedance element independently of one another.

22. The apparatus as claimed in claim 17 further comprising an eighth inverter, said eighth inverter having a pair of terminals, one of said pair of terminals of said eighth inverter being coupled to said other of said pair of terminals of said seventh inverter.

* * * * *